(12) United States Patent
Sakai (10) Patent No.: US 12,401,330 B2
(45) Date of Patent: Aug. 26, 2025

(54) AUDIO CIRCUIT (71) Applicant: ROHM CO., LTD., Kyoto (JP)

(72) Inventor: Mitsuteru Sakai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 245 days.

(21) Appl. No.: 18/193,171

(22) Filed: Mar. 30, 2023

(65) Prior Publication Data

US 2023/0238926 A1 Jul. 27, 2023

Related U.S. Application Data

(63) Continuation of application No. PCT/JP2021/031523, filed on Aug. 27, 2021.

(30) Foreign Application Priority Data

Sep. 30, 2020 (JP) ................................. 2020-166165

(51) Int. Cl.
  *H03F 3/00* (2006.01)
  *H03F 3/217* (2006.01)
  *H03F 3/45* (2006.01)
  *H03K 4/06* (2006.01)
  *H03K 5/26* (2006.01)
  *H03K 19/0175* (2006.01)
  *H04R 3/04* (2006.01)

(52) U.S. Cl.
  CPC ......... *H03F 3/217* (2013.01); *H03F 3/45479* (2013.01); *H03K 4/06* (2013.01); *H03K 5/26* (2013.01); *H03K 19/017509* (2013.01); *H04R 3/04* (2013.01); *H03F 2200/03* (2013.01); *H04R 2499/13* (2013.01)

(58) Field of Classification Search
  CPC ....... H03F 3/217; H03F 3/45479; H03K 4/06; H03K 5/26; H03K 19/017509; H04R 3/04
  See application file for complete search history.

(56) References Cited

FOREIGN PATENT DOCUMENTS

| JP | 2012029185 A | 2/2012 |
|---|---|---|
| JP | 5618776 B2 | 11/2014 |
| JP | 2016046544 A | 4/2016 |

OTHER PUBLICATIONS

International Search Report for International Application No. PCT/JP2021/031523; Date of Mailing, Oct. 19, 2021; and IPRP Issued on Mar. 28, 2023 with Written Opinion of the ISA; date of Mailing, Oct. 19, 2021.
JPO Notification of Reason(s) for Refusal for corresponding JP Application No. 2022-553552; issued Mar. 11, 2025.

*Primary Examiner* — Rasha S Al Aubaidi
(74) *Attorney, Agent, or Firm* — CANTOR COLBURN LLP (57) ABSTRACT

A class D amplifier circuit receives an analog audio signal with a first reference voltage as its center level, and outputs an output pulse signal having a duty cycle that corresponds to the analog audio signal. A bias circuit generates a second reference voltage having a voltage level obtained as a division of the first reference voltage and the power supply voltage. A periodic voltage generating circuit of the class D amplifier circuit generates a periodic voltage having a triangle waveform or otherwise a sawtooth waveform having an amplitude that corresponds to the second reference voltage.

8 Claims, 8 Drawing Sheets

AUDIO CIRCUIT

CROSS REFERENCE TO RELATED APPLICATIONS

This application is a continuation under 35 U.S.C. § 120 of PCT/JP2021/031523, filed Aug. 27, 2021, which is incorporated herein reference, and which claimed priority to Japanese Application No. 2020-166165, filed Sep. 30, 2020, the entire content of which is also incorporated herein by reference.

BACKGROUND

1. Technical Field

The present disclosure relates to an audio amplifier circuit that drives a speaker or headphones.

2. Description of the Related Art

Figure 1:
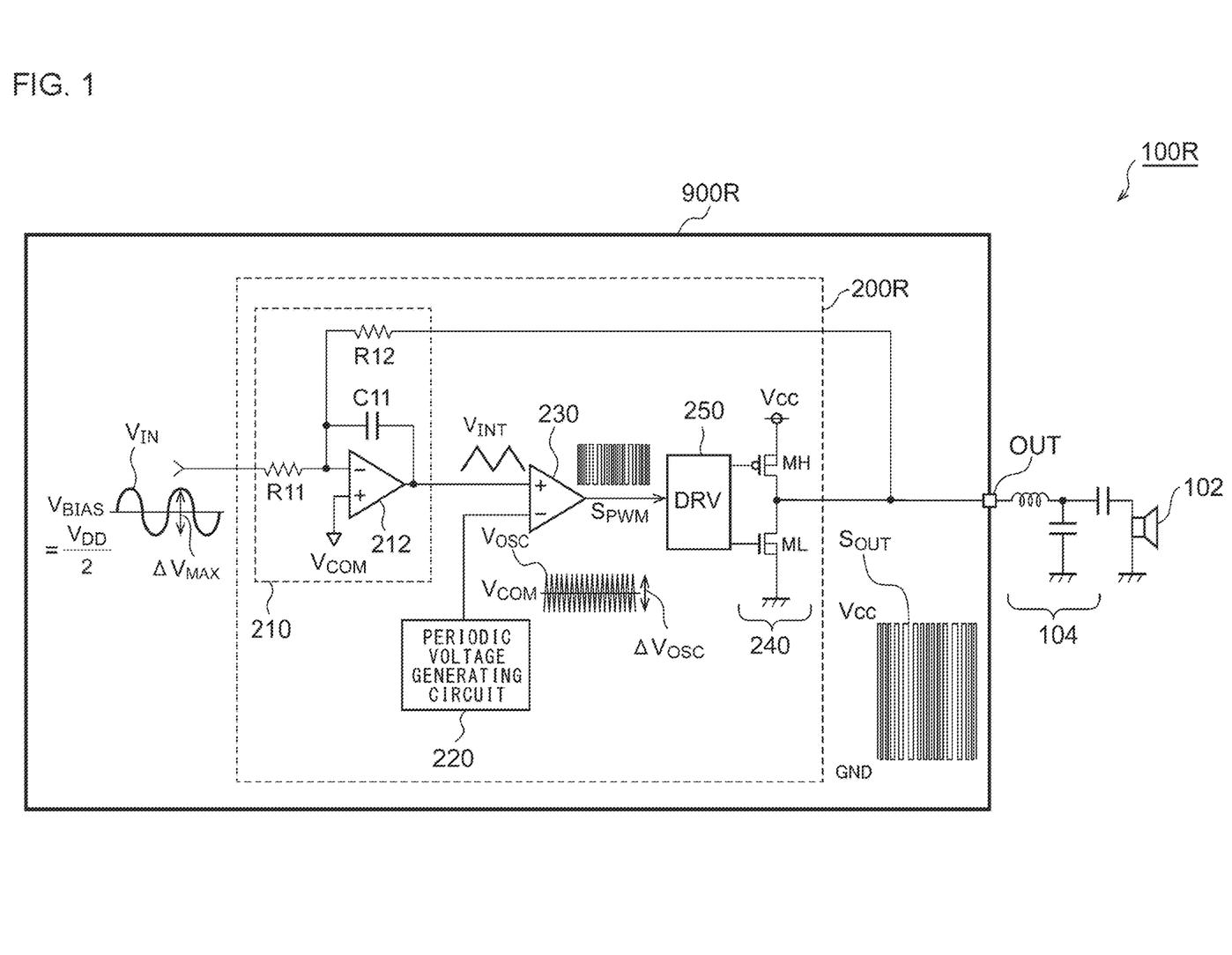
FIG. 1 is a block diagram showing an audio system employing a class D amplifier.

As a power amplifier that drives an electroacoustic conversion element such as a speaker, headphones, or the like, a high-efficiency class D amplifier is employed. FIG. 1 is a block diagram showing an audio system 100R employing such a class D amplifier. The audio system 100R mainly includes a speaker 102, a low pass filter 104, and an audio circuit 900R.

The audio circuit 900R includes a class D amplifier circuit 200R. The class D amplifier circuit 200R generates an output pulse signal $S_{OUT}$ having a duty cycle that corresponds to an analog audio signal $V_{IN}$. The low-pass filter 104 removes high-frequency components of the output pulse signal $S_{OUT}$ of the class D amplifier circuit 200R and supplies the output pulse signal $S_{OUT}$ to the speaker 102.

The class D amplifier circuit 200R is configured as a class D amplifier with a feedback function including an integrator 210, a periodic voltage generating circuit 220, a Pulse Width Modulation (PWM) comparator 230, and a bridge circuit 240.

The integrator 210 includes resistors R11 and R12, a capacitor C11, and an error amplifier 212. Regarding the inverting input terminal (−) of the error amplifier 212, the analog audio signal $V_{IN}$ is input via the first resistor R11, and a feedback signal $V_{FB}$ that corresponds to the output pulse signal $S_{OUT}$ is input via the second resistor R12. The capacitor C11 is provided between the output and the inverting input terminal of the error amplifier 212. Furthermore, a reference voltage $V_{COM}$ is input to the non-inverting input terminal of the error amplifier 212. The gain $g_D$ of the class D amplifier circuit 200R is represented by R12/R11.

The periodic voltage generating circuit 220 generates a periodic voltage $V_{OSC}$ having a triangle waveform or otherwise a sawtooth waveform. The periodic voltage $V_{OSC}$ is configured as a pulse width modulation carrier wave. The periodic voltage $V_{OSC}$ has a PWM frequency that is higher than the audible frequency band (20 Hz to 20 kHz) and is determined in a range of several hundred kHz to several MHz. The PWM comparator 230 compares the output signal $V_{INT}$ of the integrator 210 with the periodic voltage $V_{OSC}$ and generates a PWM signal $S_{PWM}$ that switches between the high level and the low level according to the comparison result.

The driver 250 switches a high-side transistor MH and a low-side transistor ML in a complementary manner according to the PWM signal $S_{PWM}$. The driver 250 inserts dead time such that the high-side transistor MH and the low-side transistor ML do not turn on at the same time.

With the audio circuit 900R shown in FIG. 1, the periodic voltage $V_{OSC}$ generated by the periodic voltage generating circuit 220 has a fixed amplitude regardless of the power supply voltage $V_{CC}$.

It is necessary to design the voltage range of the output voltage $V_{INT}$ of the integrator 210 such that it is included in a range between the peak and the bottom of the periodic voltage $V_{OSC}$. Accordingly, the maximum amplitude $\Delta V_{MAX}$ of the analog audio signal $V_{IN}$ is restricted by the amplitude $\Delta V_{OSC}$ of the periodic voltage $V_{OSC}$. Specifically, the amplitude $\Delta V_{OSC}$ of the periodic voltage $V_{OSC}$ is fixed to on the order of 2 Vpp, for example. Furthermore, the analog audio signal $V_{IN}$ is determined to have a center level VBIAS of 2.5 V and a maximum amplitude $\Delta V_{MAX}$ of 5 Vpp.

In a case in which the audio circuit 900R shown in FIG. 1 is employed in a system with a large power supply voltage $V_{CC}$, i.e., with the output pulse signal $S_{OUT}$ having a large amplitude, such an arrangement is not able to use the input voltage $V_{IN}$ having such a large amplitude (signal level) due to the restriction of the periodic voltage $V_{OSC}$.

Furthermore, with the audio system 100R, in order to provide full-scale output, the class D amplifier 200R must be designed such that it has a gain g of $V_{CC}/\Delta V_{MAX}$. In a case in which $V_{CC}$=15 V, and $\Delta V_{MAX}$=5 V, the integrator 210 must be designed with a gain g of 3. However, in a case in which the gain g is large, this leads to degraded noise characteristics.

SUMMARY

The present disclosure has been made in order to solve the problems described above.

An audio circuit according to the present disclosure includes: a class D amplifier circuit structured to receive an analog audio signal with a first reference voltage as a center level, and to output an output pulse signal having a duty cycle that corresponds to the analog audio signal; and a bias circuit structured to generate a second reference voltage having a voltage level obtained by dividing the first reference voltage and a power supply voltage. The class D amplifier circuit includes: an integrator structured to receive the analog audio signal and a feedback signal that corresponds to the output pulse signal; a periodic voltage generating circuit structured to generate a periodic voltage having a triangle waveform or a sawtooth waveform; a Pulse Width Modulation (PWM) comparator structured to compare an output of the integrator with the periodic voltage; a bridge circuit structured to receive a supply of the power supply voltage; and a driver structured to drive the bridge circuit according to an output of the PWM comparator. The integrator includes: a first operational amplifier structured to receive the second reference voltage via a non-inverting input terminal; a first resistor structured such that the analog audio signal is input to one end thereof, and the other end thereof is coupled to an inverting input terminal of the first operational amplifier; and a second resistor structured such that the feedback signal is input to one end thereof, and the other end thereof is coupled to the inverting input terminal of the first operational amplifier. The periodic voltage generating circuit generates a periodic voltage having an amplitude that corresponds to the second reference voltage.

It should be noted that any combination of the components described above, or any manifestation of the present invention may be mutually substituted between a method, apparatus and so forth, which are also effective as an embodiment of the present invention. The description of the items (means for solving the problems) is by no means intended to describe all the indispensable features of the present invention. That is to say, any sub-combination of the features as described above is also encompassed in the technical scope of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Description will be made regarding the outline of several exemplary embodiments of the present disclosure. The outline is a simplified explanation regarding several concepts of one or multiple embodiments as a prelude to the detailed description described later in order to provide a basic understanding of the embodiments. That is to say, the outline described below is by no means intended to restrict the scope of the present invention and the present disclosure. Furthermore, the outline described below is by no means a comprehensive outline of all the possible embodiments. That is to say, the outline described below by no means restricts essential components of the embodiments. For convenience, in some cases, an "embodiment" as used in the present specification represents a single or multiple embodiments (examples and modifications) disclosed in the present specification.

An audio circuit according to one embodiment includes: a class D amplifier circuit structured to receive an analog audio signal with a first reference voltage as a center level, and to output an output pulse signal having a duty cycle that corresponds to the analog audio signal; and a bias circuit structured to generate a second reference voltage having a voltage level obtained by dividing the first reference voltage and a power supply voltage. The class D amplifier circuit includes: an integrator structured to receive the analog audio signal and a feedback signal that corresponds to the output pulse signal; a periodic voltage generating circuit structured to generate a periodic voltage having a triangle waveform or a sawtooth waveform; a Pulse Width Modulation (PWM) comparator structured to compare an output of the integrator with the periodic voltage; a bridge circuit structured to receive a supply of the power supply voltage; and a driver structured to drive the bridge circuit according to an output of the PWM comparator. The integrator includes: a first operational amplifier structured to receive the second reference voltage via a non-inverting input terminal; a first resistor structured such that the analog audio signal is input to one end thereof, and the other end thereof is coupled to an inverting input terminal of the first operational amplifier; and a second resistor structured such that the feedback signal is input to one end thereof, and the other end thereof is coupled to the inverting input terminal of the first operational amplifier. The periodic voltage generating circuit generates a periodic voltage having an amplitude that corresponds to the second reference voltage.

With this configuration, the second reference voltage supplied to the integrator changes according to the power supply voltage. Furthermore, the amplitude of the periodic voltage, which is employed as a pulse width modulation carrier wave, also changes according to the second reference voltage. As a result, this provides an improved degree of freedom in the design of the signal level of the analog audio signal.

In one embodiment, the signal level (center level and maximum amplitude) of the analog audio signal may be set so as to be proportional to the power supply voltage. In this case, this allows the gain of the class D amplifier circuit to be maintained at a constant value regardless of the power supply voltage.

Also, in one embodiment, in a case in which the power supply voltage is high, the signal level (center level and maximum amplitude) of the analog audio signal may be increased so as to set the gain of the class D amplifier circuit to a low value. With this, such an arrangement is capable of suppressing degradation of noise characteristics.

In one embodiment, the periodic voltage generating circuit may include: a clock generating circuit structured to generate a first clock signal with an amplitude having a voltage level that is twice that of the second reference voltage; and a triangle wave generating circuit structured to generate the periodic voltage based on the first clock signal. With this, such an arrangement is capable of generating a triangle wave with the second reference voltage as the center level.

In one embodiment, the clock generating circuit may include: a level shift circuit structured to receive a second clock signal having a frequency that is twice that of the periodic voltage, and to shift a high level voltage of the second clock signal to a voltage level that is twice that of the second reference voltage; and a frequency divider structured to divide the frequency of a third clock signal level-shifted by the level shift circuit by 2, so as to generate the first clock signal. With this, such an arrangement allows the duty cycle of the first clock signal to be maintained at 50%, thereby providing improved waveform quality of the triangle wave.

In one embodiment, the frequency divider may include a flip-flop.

In one embodiment, the triangle wave generating circuit may include: a second operational amplifier; a third resistor structured such that the first clock signal is received via one end thereof, and the other end thereof is coupled to an inverting input terminal of the second operational amplifier; a first capacitor provided between an output terminal of the second operational amplifier and the inverting input terminal of the second operational amplifier; a third operational amplifier structured such that the second reference voltage is received via a non-inverting input terminal thereof, and an output terminal thereof is coupled to a non-inverting input terminal of the second operational amplifier; a fourth resistor structured such that one end thereof is coupled to the output terminal of the second operational amplifier, and the other end thereof is coupled to an inverting input terminal of the third operational amplifier; and a second capacitor provided between an output terminal of the third operational amplifier and the inverting input terminal of the third operational amplifier. The output voltage of the second operational amplifier may be employed as the periodic voltage. With this configuration, the voltage supplied to the non-inverting input terminal of the second operational amplifier is adjusted such that the center level of the periodic voltage approaches the second reference voltage. As a result, this is capable of suppressing characteristics degradation due to variation in the output impedance of the clock generating circuit and fluctuation of the power supply voltage.

In one embodiment, the bias circuit may include: a first voltage dividing circuit structured to generate a midpoint voltage that is ½ times the power supply voltage; and a second voltage dividing circuit structured to divide the first reference voltage and the midpoint voltage.

In one embodiment, the second voltage dividing circuit may have a voltage dividing ratio that is equal to the gain of the class D amplifier circuit. This allows the class D amplifier circuit to be operated at an optimum operating point that corresponds to the power supply voltage.

In one embodiment, the audio circuit may be monolithically integrated on a single substrate. Examples of such an "integrated" arrangement include: an arrangement in which all the circuit components are formed on a substrate; and an arrangement in which principal circuit components are monolithically integrated. Also, a part of the circuit components such as resistors or capacitors may be arranged in the form of components external to such a substrate in order to adjust the circuit constants. By integrating the circuit on a single chip, such an arrangement allows the circuit area to be reduced and allows the circuit elements to have uniform characteristics.

Embodiments

Description will be made below regarding preferred embodiments with reference to the drawings. The same or similar components, members, and processes are denoted by the same reference numerals, and redundant description thereof will be omitted as appropriate. The embodiments have been described for exemplary purposes only and are by no means intended to restrict the present disclosure or the present invention. Also, it is not necessarily essential for the present disclosure or the present invention that all the features or a combination thereof be provided as described in the embodiments.

In the present specification, the state represented by the phrase "the member A is coupled to the member B" includes a state in which the member A is indirectly coupled to the member B via another member that does not affect the electrical connection between them, or that does not damage the functions of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C, via another member that does not affect the electrical connection between them, or that does not damage the functions of the connection between them, in addition to a state in which they are directly coupled.

Figure 2:
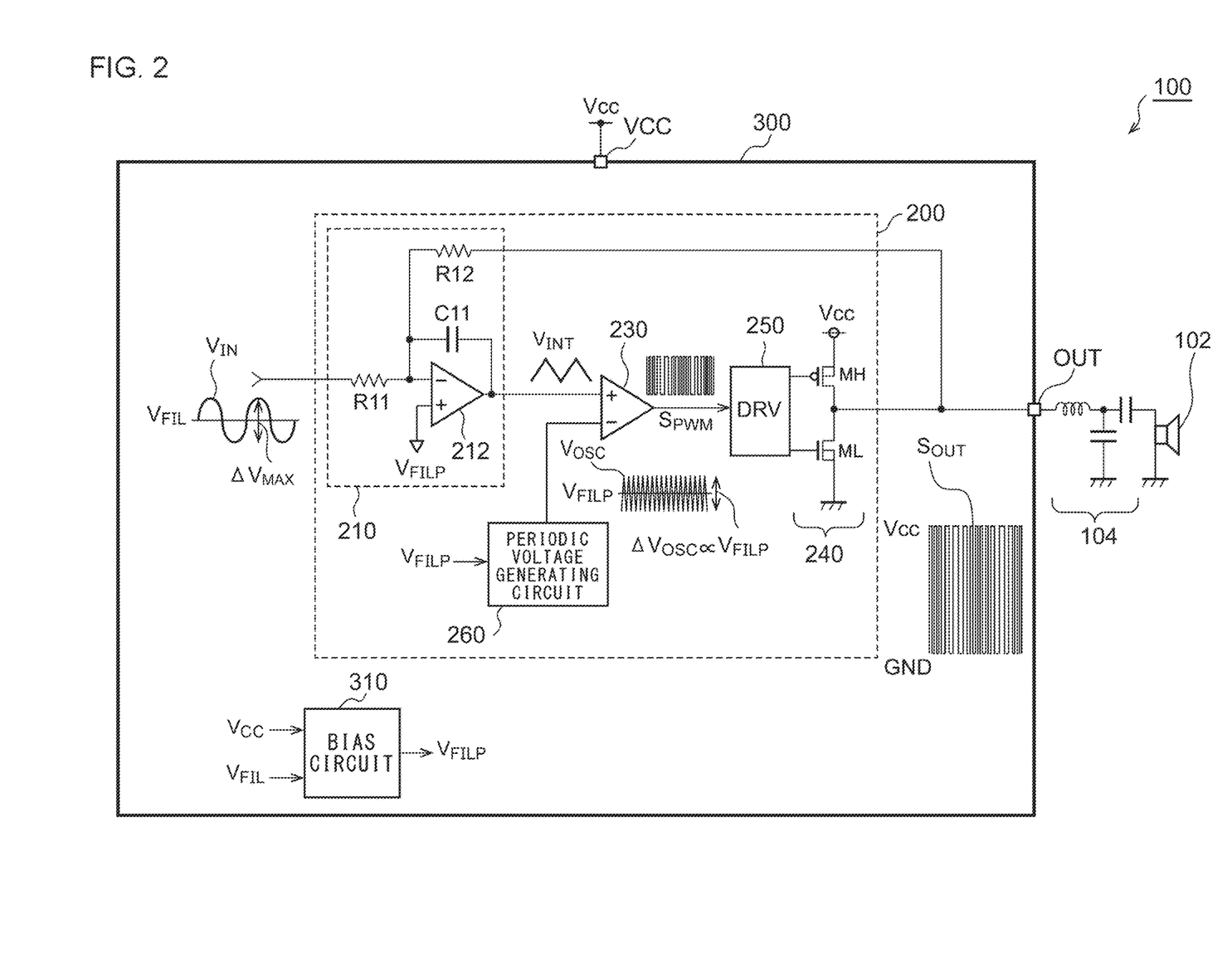
FIG. 2 is a block diagram showing an audio system provided with an audio circuit according to an embodiment.

FIG. 2 is a block diagram showing an audio system 100 including an audio circuit 300 according to an embodiment. The audio system 100 includes a speaker 102, a low pass filter 104, and an audio circuit 300.

The audio circuit 300 includes a class D amplifier circuit 200 and a bias circuit 310 and is integrated on a single semiconductor chip configured as a function IC (integrated circuit). An external power supply voltage $V_{CC}$ is supplied to a power supply pin VCC of the audio circuit 300.

The class D amplifier circuit 200 receives an input of an analog audio signal $V_{IN}$ with a first reference voltage $V_{FIL}$ as its center level. The class D amplifier circuit 200 generates an output pulse signal $S_{OUT}$ having a duty cycle that corresponds to the analog audio signal $V_{IN}$. The low-pass filter 104 removes high-frequency components of the output pulse signal $S_{OUT}$ of the class D amplifier circuit 200 and supplies the output pulse signal $S_{OUT}$ to the speaker 102.

The first reference voltage $V_{FIL}$ (or a voltage that is proportional to the first reference voltage $V_{FIL}$) and the power supply voltage $V_{CC}$ (or a voltage that is proportional to the power supply voltage $V_{CC}$) are supplied to the bias circuit 310. The bias circuit 310 generates a second reference voltage $V_{FILP}$ obtained by dividing the first reference voltage $V_{FIL}$ and the power supply voltage $V_{CC}$.

The class D amplifier circuit 200 is configured as a class D amplifier with a feedback function, including an integrator 210, a periodic voltage generating circuit 260, a Pulse Width Modulation (PWM) comparator 230, and a bridge circuit 240.

The integrator 210 includes resistors R11 and R12, a capacitor C11, and an error amplifier 212. Regarding the inverting input terminal (−) of the error amplifier 212, the analog audio signal $V_{IN}$ is input via the first resistor R11, and a feedback signal $V_{FB}$ that corresponds to the output pulse signal $S_{OUT}$ is input via the second resistor R12. The capacitor C11 is provided between the output and the inverting input terminal of the error amplifier 212. The second reference voltage $V_{FILP}$ is input to the non-inverting input terminal of the error amplifier 212. The gain go of the class D amplifier circuit 200 is represented by R12/R11.

The class D amplifier circuit 200 is configured to have a variable gain. Also, the class D amplifier circuit 200 may be configured to allow the designer of the audio system 100 to freely change the gain to a desired value.

Preferably, the second reference voltage $V_{FILP}$ is generated so as to satisfy the following Expression.

$$V_{FILP}=(V_{CC}/2 \times R12+V_{FIL} \times R11)/(R11+R12)$$

The periodic voltage generating circuit 260 generates a periodic voltage $V_{OSC}$ having a triangle waveform or otherwise a sawtooth waveform. The periodic voltage $V_{OSC}$ is configured as a pulse width modulation carrier wave. The periodic voltage $V_{OSC}$ has a PWM frequency that is higher than the audible frequency band (20 Hz to 20 kHz) and is determined in a range of several hundred kHz to several MHz.

The PWM comparator 230 compares the output signal $V_{INT}$ of the integrator 210 with the periodic voltage $V_{OSC}$ and generates a PWM signal $S_{PWM}$ that switches between the high level and the low level according to the comparison result.

The bridge circuit 240 is configured as a push-pull inverter and receives the supply of the power supply voltage $V_{CC}$. The bridge circuit 240 includes a high-side transistor MH and a low-side transistor ML. The high-side transistor MH may be configured as a PMOS transistor or an NMOS transistor.

The driver 250 switches the high-side transistor MH and the low-side transistor ML of the bridge circuit 240 in a complementary manner according to the PWM signal $S_{PWM}$. The driver 250 inserts dead time such that the high-side transistor MH and the low-side transistor ML do not turn on at the same time.

The periodic voltage generating circuit 260 receives the supply of the second reference voltage $V_{FILP}$. The periodic voltage generating circuit 260 generates the periodic voltage $V_{OSC}$ having a peak-to-peak amplitude $\Delta V_{OSC}$ that corresponds to the second reference voltage $V_{FLIP}$. For example, the amplitude $\Delta V_{OSC}$ may be designed to be $V_{CC}/N$ (N represents a constant). For example, an arrangement may be made in which N=4.

The above is the configuration of the audio circuit 300. Next, description will be made regarding the operation thereof. FIGS. 3A through 3E are diagrams for explaining the operation of the audio circuit 300 shown in FIG. 2. FIGS. 3A through 3E show different combinations of the power supply voltage $V_{CC}$, the gain of the class D amplifier circuit 200, and the signal level of the analog audio signal $V_{IN}$.

Figure 3A:
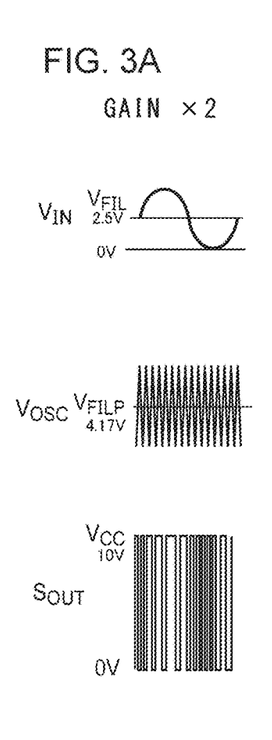
FIGS. 3A through 3E are diagrams for explaining the operation of the audio circuit shown in FIG. 2.
Figure 3B:
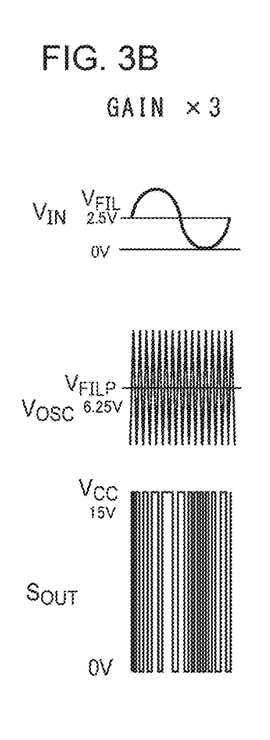
Figure 3C:
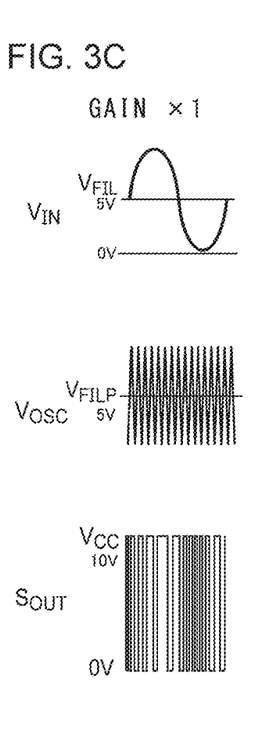
Figure 3D:
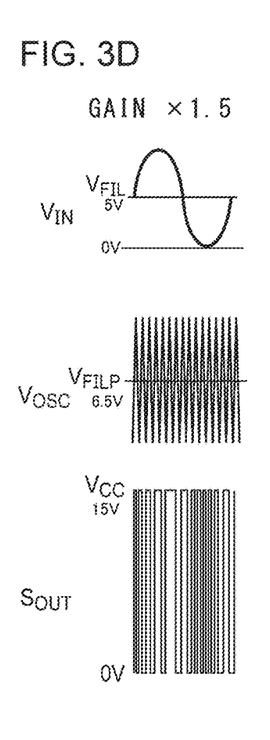
Figure 3E:
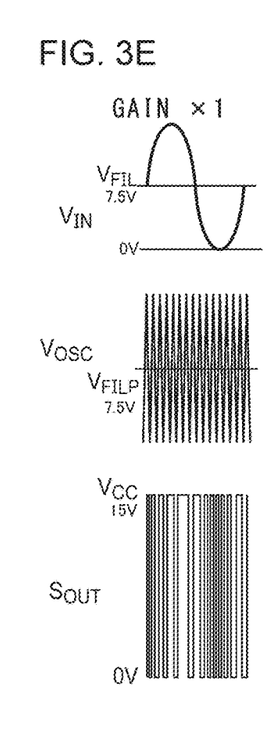

For ease of understanding, FIGS. 3A and 3C each show an example in which $V_{CC}$=10 V, and FIGS. 3B, 3D, and 3E each show an example in which $V_{CC}$=15 V. Furthermore, FIGS. 3A and 3B each show an example in which $V_{FIL}$=2.5 V, FIGS. 3C and 3D each show an example in which $V_{FIL}$=5 V, and FIG. 3E shows an example in which $V_{FIL}$=7.5 V. FIGS. 3A through 3E show examples in which the gain is set to 2, 3, 1, 1.5, and 1, respectively.

In the examples shown in FIGS. 3A through 3E, the second reference voltage $V_{FILP}$, which is employed as the center level of the periodic voltage $V_{OSC}$, is set to 4.17 V, 6.25 V, 5 V, 6.5 V, and 7.5 V, respectively. Furthermore, in FIGS. 3A through 3E, the peak-to-peak amplitude $\Delta V_{OSC}$ of the periodic voltage $V_{OSC}$ is ¼ times the power supply voltage $V_{DD}$, which is set to 2.5 V, 3.75 V, 2.5 V, 3.75 V, and 3.5 V, respectively. In all cases, the analog audio signal $V_{IN}$ can be amplified in full scale to drive the speaker 102.

As described above, with the audio circuit 300 according to the present embodiment, this allows flexible design of the signal level according to the power supply voltage $V_{CC}$.

For example, as shown in FIGS. 3C and 3E, this allows the signal level (center level and maximum amplitude) of the analog audio signal $V_{IN}$ to be set so as to be proportional to the power supply voltage $V_{CC}$. In this case, such an arrangement allows the class D amplifier circuit 200 to have a constant gain regardless of the power supply voltage $V_{CC}$.

Furthermore, as shown in FIGS. 3C, 3E, and 3D, in a case in which the power supply voltage $V_{CC}$ is high, by increasing the signal level (center level and maximum amplitude) of the analog audio signal $V_{IN}$, such an arrangement allows the gain of the class D amplifier circuit 200 to be set to a small value. With this, such an arrangement provides improved noise characteristics as compared with a case in which the class D amplifier circuit 200 has a high gain (e.g., 3).

Also, the signal level of the analog audio signal $V_{IN}$ may be determined according to the setting value of the volume. With this, such an arrangement is capable of providing full-scale output according to various volumes.

The present disclosure encompasses various kinds of circuits that can be regarded as a circuit configuration shown in FIG. 2, or otherwise that can be derived from the aforementioned description. That is to say, the present invention is not restricted to a specific configuration. Specific description will be made below regarding examples for clarification and ease of understanding of the essence of the present invention and the circuit operation. That is to say, the following description will by no means be intended to restrict the technical scope of the present invention.

Figure 4:
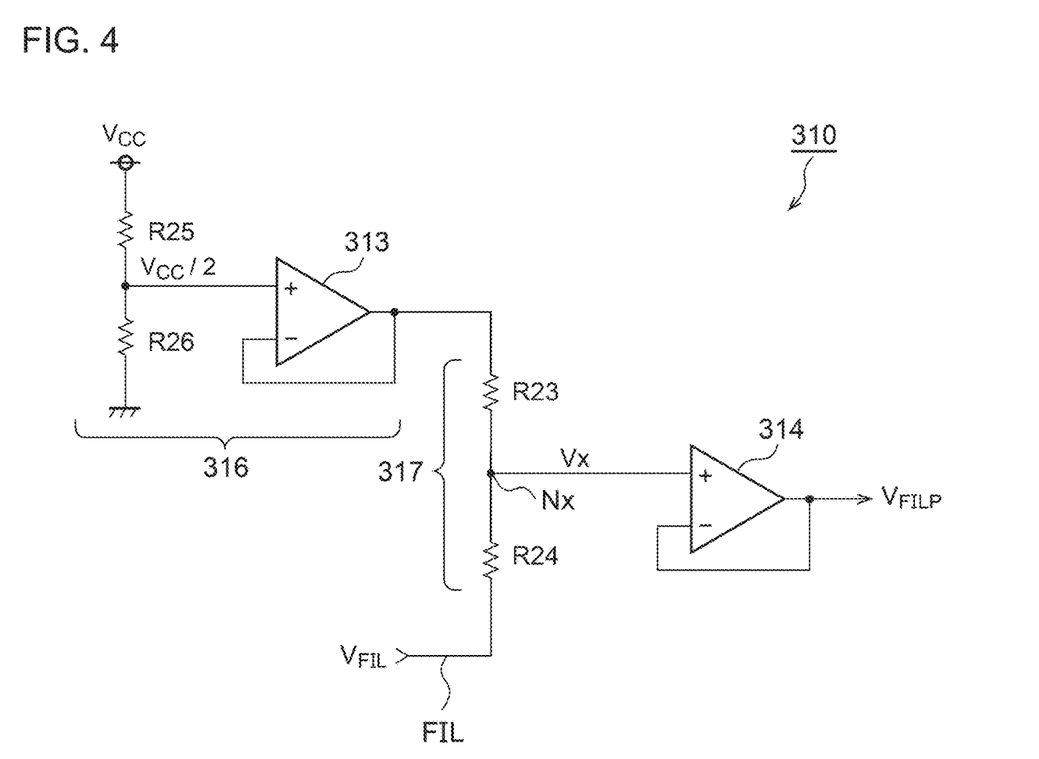
FIG. 4 is a circuit diagram showing an example configuration of a bias circuit.

FIG. 4 is a circuit diagram showing an example configuration of the bias circuit 310. The bias circuit 310 includes resistors R23 through R26, and buffers 313 and 314.

The fifth resistor R25, the sixth resistor R26, and the buffer 313 form a first voltage dividing circuit 316 that divides the power supply voltage $V_{CC}$. In a case in which R25=R26, the voltage dividing circuit 316 generates a midpoint voltage $V_{CC}/2$ of the power supply voltage $V_{CC}$, and outputs the midpoint voltage $V_{CC}/2$ via the buffer 313.

The third resistor R23 and the fourth resistor R24 are provided between the output of the voltage dividing circuit 316 and a node (line) FIL at which the first reference voltage $V_{FIL}$ occurs and form a second voltage dividing circuit 317.

The resistance value ratio between the third resistor R23 and the fourth resistor R24 may be determined according to the gain $g_D$ of the class D amplifier circuit 200, i.e., the resistance values of the first resistor R11 and the second resistor R12 shown in FIG. 2.

$$R24:R23=R11:R12$$

A voltage Vx, which is obtained as an internal division of the voltage $V_{CC}/2$ and the voltage $V_{FIL}$, occurs at a coupling node Nx that couples the third resistor R23 and the fourth resistor R24.

$$Vx=(V_{FIL} \times R23 + V_{CC}/2 \times R24)/(R23+R24)$$

The buffer 314 has a high input impedance and a low output impedance. The buffer 314 outputs the second reference voltage $V_{FILP}$ having the same voltage level as that of the voltage Vx.

Figure 5:
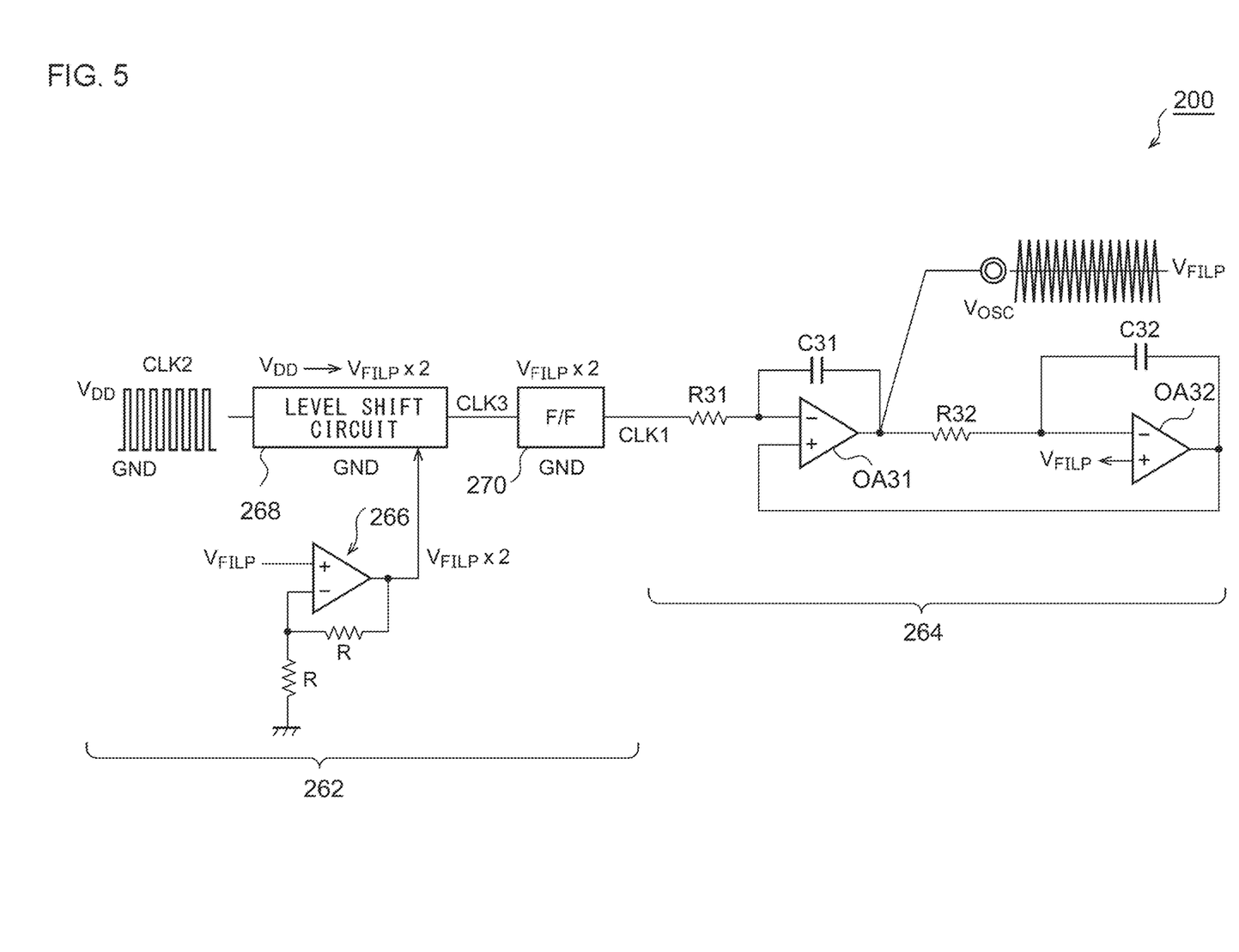
FIG. 5 is a circuit diagram showing an example configuration of a periodic voltage generating circuit.

FIG. 5 is a circuit diagram showing an example configuration of the periodic voltage generating circuit 260. The periodic voltage generating circuit 260 includes a clock generating circuit 262 and a triangle wave generating circuit 264.

The clock generating circuit 262 generates a first clock signal CLK1 with an amplitude having a voltage level ($2 \times V_{FILP}$) that is twice that of the second reference voltage $V_{FILP}$. The triangle wave generating circuit 264 generates the periodic voltage $V_{OSC}$ based on the first clock signal CLK1.

A voltage source 266 generates a voltage level ($2 \times V_{FILP}$) that is twice the second reference voltage $V_{FILP}$. A level shift circuit 268 receives an input of a second clock signal CLK2 having a frequency that is twice that of the periodic voltage $V_{OSC}$. The level shift circuit 268 shifts the level of the high-level voltage of the second clock signal CLK2 (e.g., power supply voltage $V_{DD}$) to the voltage level ($2 \times V_{FILP}$) that is twice the second reference voltage $V_{FILP}$.

A frequency divider 270 divides the frequency of the third clock signal CLK3 level-shifted by the level shift circuit 268 by 2, so as to generate the first clock signal CLK1. For example, the frequency divider 270 may be configured as a flip-flop. In some cases, the duty cycle of the clock output from the level shift circuit 268 deviates from 50% due to the clock signal passing through the level shift circuit 268, or due to fluctuation of the power supply voltage. With the clock generating circuit 262 shown in FIG. 5, the second clock signal CLK2 having a frequency that is twice the final frequency is input to the level shift circuit 268. Subsequently, after the level of the second clock signal CLK2 is shifted, the frequency of the clock signal CLK2 is divided by 2, thereby allowing the duty cycle of the first clock signal CLK1 to be maintained at 50%. This provides improved quality of the triangle waveform, thereby providing improved modulation precision.

Next, description will be made regarding an example configuration of the triangle wave generating circuit 264. The triangle wave generating circuit 264 includes operational amplifiers OS31 and OA32, resistors R31 and R32, and capacitors C31 and C32. The resistor R31 is arranged such that it receives the first clock signal CLK1 via its one end, and the other end thereof is coupled to the inverting input terminal (−) of the operational amplifier OA31. The capacitor C31 is provided between the output terminal and the inverting input terminal (−) of the operational amplifier OA31.

The second reference voltage $V_{FILP}$ is input to the non-inverting input terminal of the operational amplifier OA32. The output terminal of the operational amplifier OA32 is coupled to the non-inverting input terminal (+) of the operational amplifier OA31. One end of the resistor R32 is coupled to the output terminal of the operational amplifier OA31. The other end thereof is coupled to the inverting input terminal of the operational amplifier OA32. The capacitor C32 is provided between the output terminal and the inverting input terminal of the operational amplifier OA32. The output voltage of the operational amplifier OA31 is employed as the periodic voltage $V_{OSC}$.

With this configuration, the voltage supplied to the non-inverting input terminal of the operational amplifier OA31 is adjusted such that the center level of the periodic voltage $V_{OSC}$ approaches the second reference voltage $V_{FLIP}$. As a result, such an arrangement is capable of suppressing characteristics degradation due to variation in the output impedance of the clock generating circuit 262 and fluctuation of the power supply voltage.

Next, description will be made regarding the input interface of the audio circuit 300.

Figure 6:
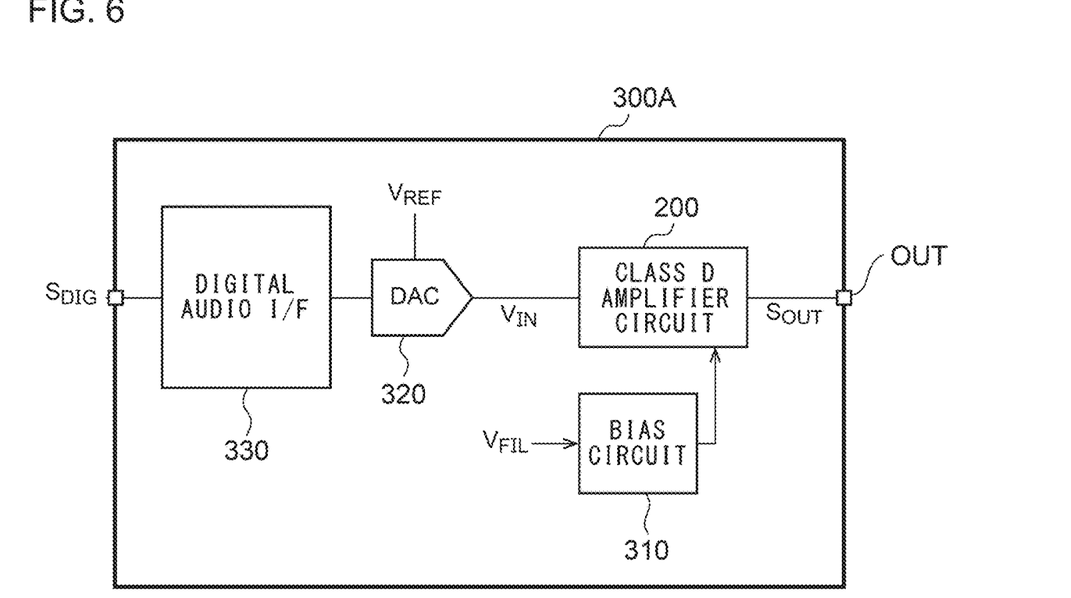
FIG. 6 is a diagram showing an example configuration of an audio circuit.

FIG. 6 is a diagram showing an example configuration (300A) of the audio circuit 300. The audio circuit 300A includes an interface circuit 330 and a D/A converter 320 in addition to the bias circuit 310 and the class D amplifier circuit 200.

The digital audio interface circuit 330 receives a digital audio signal $S_{DIG}$ from an external sound source. The format of the digital audio signal $S_{DIG}$ is not restricted in particular. Examples of the format of the digital audio signal $S_{DIG}$ include Inter IC Sound (I²S), etc.

The D/A converter 320 converts the digital audio signal $S_{DIG}$ received by the digital audio interface circuit 330 into an analog audio signal $V_{IN}$.

With this configuration, the center level $V_{FIL}$ of the analog audio signal $V_{IN}$ is determined according to the reference voltage $V_{REF}$ of the D/A converter 320. Accordingly, the first reference voltage $V_{FIL}$ having a voltage level based on the reference voltage $V_{REF}$ may preferably be supplied to the bias circuit 310.

Figure 7:
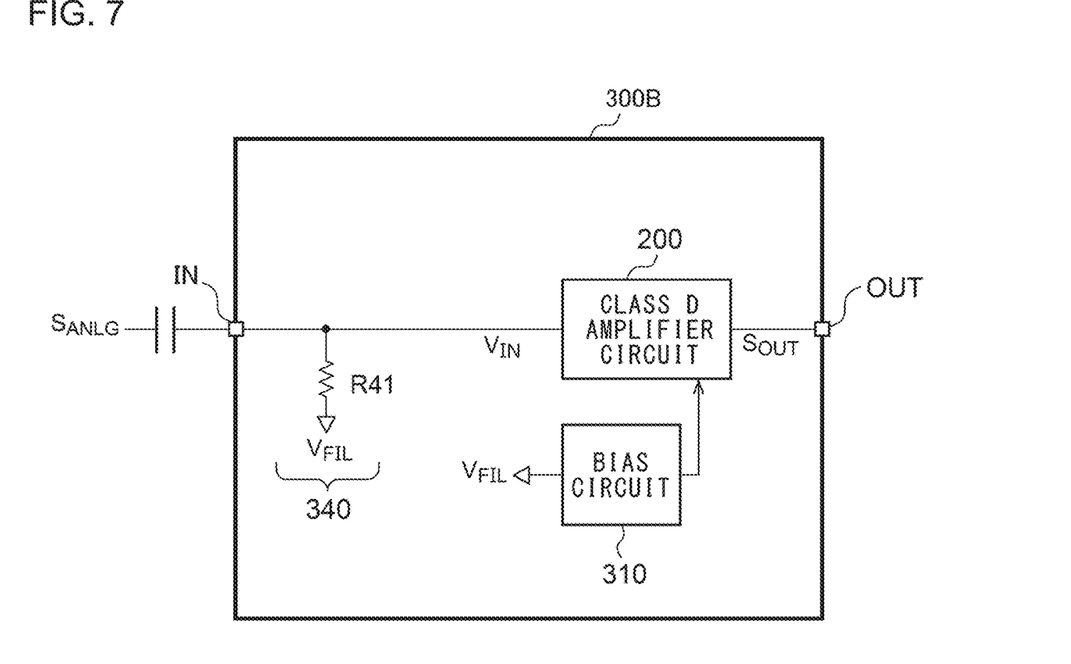
FIG. 7 is a diagram showing another example configuration of the audio circuit.

FIG. 7 is a diagram showing another example configuration (300B) of the audio circuit 300. The audio circuit 330B includes an analog input interface circuit 340 in addition to the bias circuit 310 and the class D amplifier circuit 200. The analog input interface circuit 340 includes a resistor R41 provided between the analog input pin IN and a node at which the first reference voltage $V_{FIL}$ occurs. An analog audio signal $S_{ANLG}$ is input to the analog input pin IN via a coupling capacitor. In this case, the first reference voltage $V_{FIL}$ may preferably be supplied to the bias circuit 310.

Usage

Figure 8:
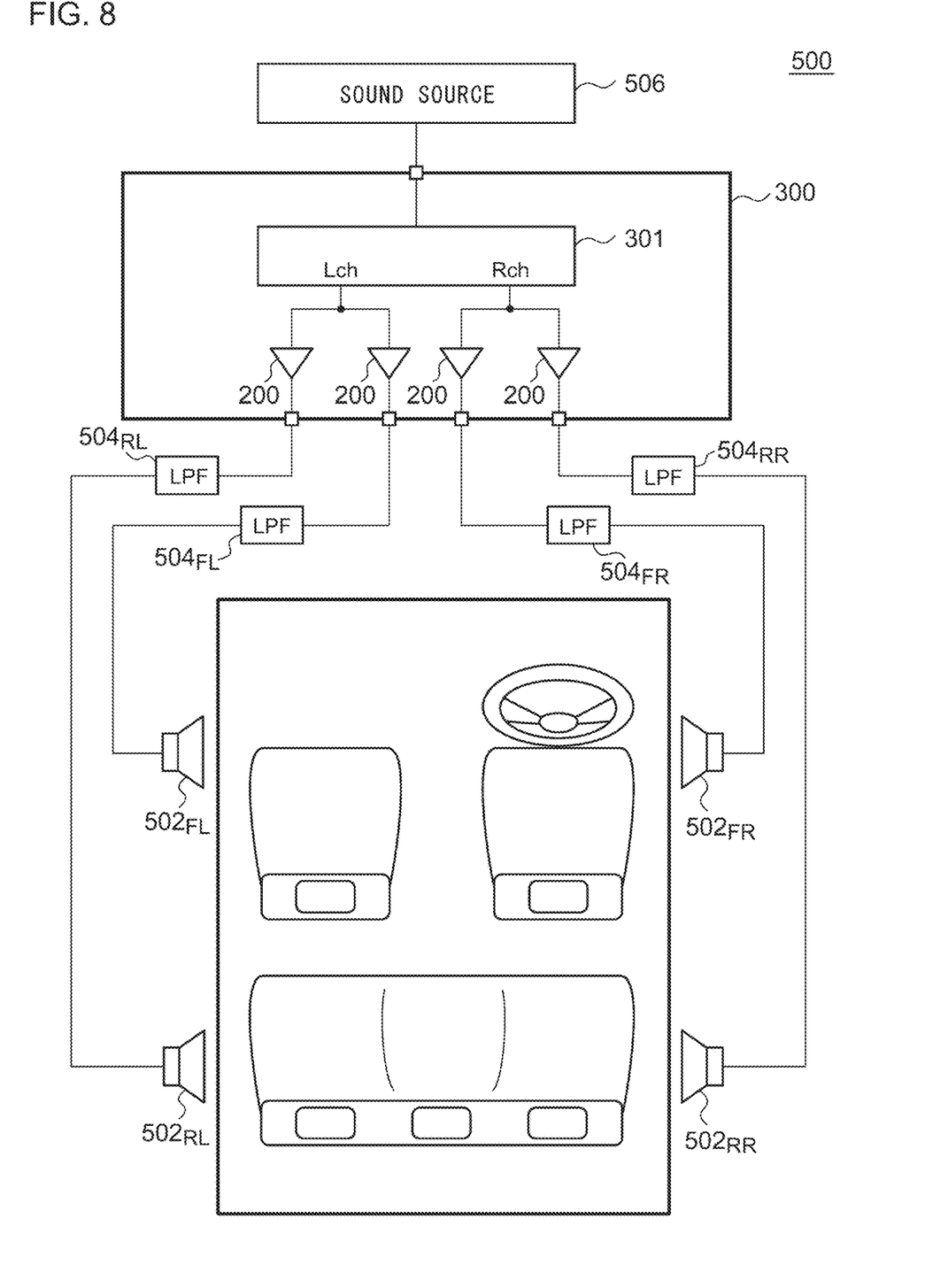
FIG. 8 is a block diagram showing an in-vehicle audio system employing an audio circuit according to an embodiment.

Description will be made regarding the usage of the audio circuit 300. FIG. 8 is a block diagram showing an in-vehicle audio system employing the audio circuit according to the embodiment.

An in-vehicle audio system 500 includes four speakers $502_{FL}$, $502_{FR}$, $502_{RL}$, and $502_{RR}$, four filters $504_{FL}$, $504_{FR}$, $504_{RL}$, and $504_{RR}$, a sound source 506, and an audio circuit 300.

The sound source 106 outputs a left-and-right (LR) two-channel or multi-channel digital audio signal. The audio circuit 300 includes a four-channel class D amplifier circuit 200 and an interface circuit 301 for communicating with the sound source 106. The interface circuit 301 can be regarded as the digital interface circuit 330 and the D/A converter 320 shown in FIG. 3.

The filter 504, the sound source 506, and the audio circuit 300 are built into an audio head unit or a car navigation apparatus. Alternatively, the audio circuit 300 may be a product independent of the sound source 106.

Figure 9A:
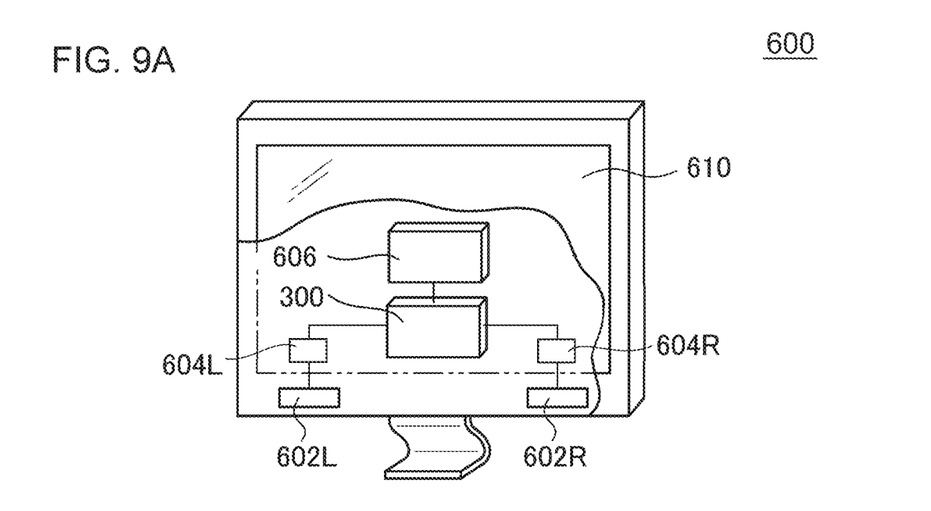
FIGS. 9A and 9B are diagrams each showing an electronic device employing an audio circuit according to an embodiment.
Figure 9B:
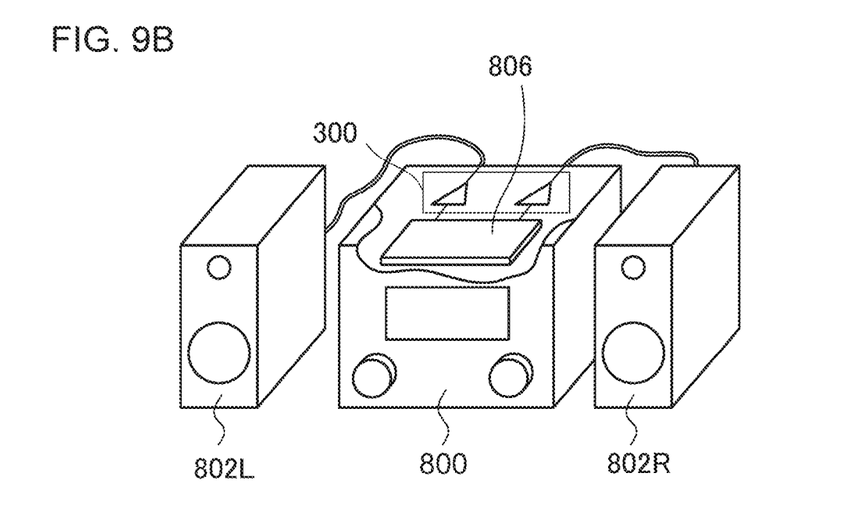

FIGS. 9A and 9B are diagrams each showing an electronic device employing the audio circuit according to the embodiment. The electronic device shown in FIG. 9A is a display apparatus 600 such as a TV, etc. The display apparatus 600 includes speakers 602L and 602R, filters 604L and 604R, a sound source 606, an audio circuit 300, and a display panel 610.

The electronic device shown in FIG. 9B is an audio component apparatus 800. The audio component apparatus 800 includes an audio signal processing circuit 806 that corresponds to a sound source, an audio circuit 300, and an unshown filter. The audio circuit 300 drives speakers 802L and 802R coupled via speaker cables.

The above-described embodiments have been described for exemplary purposes only. Rather, it can be readily conceived by those skilled in this art that various modifications may be made by making various combinations of the aforementioned components or processes. Description will be made below regarding such modifications.

Description has been made in the embodiment regarding an example employing a half-bridge type class D amplifier. Also, the present invention is applicable to a full-bridge type (BTL: Bridge-Tied Load) class D amplifier. In this case, the DC block capacitor of the low pass filter 104 becomes unnecessary. Furthermore, with the full-bridge type class D amplifier, a filterless modulation method may be employed in which the low-pass filter 104 is omitted.

What is claimed is:

1. An audio circuit comprising:
    a class D amplifier circuit structured to receive an analog audio signal with a first reference voltage as a center level, and to output an output pulse signal having a duty cycle that corresponds to the analog audio signal; and
    a bias circuit structured to generate a second reference voltage having a voltage level obtained by dividing the first reference voltage and a power supply voltage,
    wherein the class D amplifier circuit comprises:
        an integrator structured to receive the analog audio signal and a feedback signal that corresponds to the output pulse signal;
        a periodic voltage generating circuit structured to generate a periodic voltage having a triangle waveform or a sawtooth waveform;
    a Pulse Width Modulation (PWM) comparator structured to compare an output of the integrator with the periodic voltage;

a bridge circuit structured to receive a supply of the power supply voltage; and a driver structured to drive the bridge circuit according to an output of the PWM comparator, wherein the integrator comprises:
  a first operational amplifier structured to receive the second reference voltage via a non-inverting input terminal;
  a first resistor structured such that the analog audio signal is input to one end thereof, and the other end thereof is coupled to an inverting input terminal of the first operational amplifier; and
  a second resistor structured such that the feedback signal is input to one end thereof, and the other end thereof is coupled to the inverting input terminal of the first operational amplifier, and wherein the periodic voltage generating circuit generates a periodic voltage having an amplitude that corresponds to the second reference voltage,
  wherein the periodic voltage generating circuit comprises:
  a clock generating circuit structured to generate a first clock signal with an amplitude having a voltage level that is twice that of the second reference voltage; and
  a triangle wave generating circuit structured to generate the periodic voltage based on the first clock signal.

2. The audio circuit according to claim 1, wherein the clock generating circuit comprises:
  a level shift circuit structured to receive a second clock signal having a frequency that is twice that of the periodic voltage, and to shift a high level voltage of the second clock signal to a voltage level that is twice that of the second reference voltage; and
  a frequency divider structured to divide a frequency of a third clock signal level-shifted by the level shift circuit by 2, so as to generate the first clock signal.

3. The audio circuit according to claim 2, wherein the frequency divider comprises a flip-flop.

4. The audio circuit according to claim 1, wherein the triangle wave generating circuit comprises:
  a second operational amplifier;
  a third resistor structured such that the first clock signal is received via one end thereof, and the other end thereof is coupled to an inverting input terminal of the second operational amplifier;
  a first capacitor provided between an output terminal of the second operational amplifier and the inverting input terminal of the second operational amplifier;
  a third operational amplifier structured such that the second reference voltage is received via a non-inverting input terminal thereof, and an output terminal thereof is coupled to a non-inverting input terminal of the second operational amplifier;
  a fourth resistor structured such that one end thereof is coupled to the output terminal of the second operational amplifier, and the other end thereof is coupled to an inverting input terminal of the third operational amplifier; and
  a second capacitor provided between an output terminal of the third operational amplifier and the inverting input terminal of the third operational amplifier,
  and wherein an output voltage of the second operational amplifier is employed as the periodic voltage.

5. The audio circuit according to claim 1, monolithically integrated on a single substrate.

6. An in-vehicle audio system comprising:
  a speaker; and
  the audio circuit according to claim 1, structured to drive the speaker.

7. An electronic device provided with the audio circuit according to claim 1.

8. An audio circuit comprising:
  a class D amplifier circuit structured to receive an analog audio signal with a first reference voltage as a center level, and to output an output pulse signal having a duty cycle that corresponds to the analog audio signal; and
  a bias circuit structured to generate a second reference voltage having a voltage level obtained by dividing the first reference voltage and a power supply voltage,
  wherein the class D amplifier circuit comprises:
    an integrator structured to receive the analog audio signal and a feedback signal that corresponds to the output pulse signal;
    a periodic voltage generating circuit structured to generate a periodic voltage having a triangle waveform or a sawtooth waveform;
  a Pulse Width Modulation (PWM) comparator structured to compare an output of the integrator with the periodic voltage;
  a bridge circuit structured to receive a supply of the power supply voltage; and
  a driver structured to drive the bridge circuit according to an output of the PWM comparator,
  wherein the integrator comprises:
    a first operational amplifier structured to receive the second reference voltage via a non-inverting input terminal;
    a first resistor structured such that the analog audio signal is input to one end thereof, and the other end thereof is coupled to an inverting input terminal of the first operational amplifier; and
    a second resistor structured such that the feedback signal is input to one end thereof, and the other end thereof is coupled to the inverting input terminal of the first operational amplifier,
  and wherein the periodic voltage generating circuit generates a periodic voltage having an amplitude that corresponds to the second reference voltage,
  wherein the bias circuit comprises:
  a first voltage dividing circuit structured to generate a midpoint voltage that is ½ times the power supply voltage; and
  a second voltage dividing circuit structured to divide the first reference voltage and the midpoint voltage,
  wherein the second voltage dividing circuit has a voltage dividing ratio that is equal to a gain of the class D amplifier circuit.

* * * * *